United States Patent [19]
Kwak

[11] Patent Number: 6,060,359
[45] Date of Patent: May 9, 2000

[54] FLASH MEMORY CELL AND METHOD OF FABRICATED THE SAME

[75] Inventor: Jong-Seok Kwak, Chungcheongbuk-do, Rep. of Korea

[73] Assignee: LG Semicon Co., Ltd., Chungcheongbuk-Do, Rep. of Korea

[21] Appl. No.: 08/962,295

[22] Filed: Oct. 31, 1997

[30] Foreign Application Priority Data

Dec. 23, 1996 [KR] Rep. of Korea .................. 96-70176

[51] Int. Cl.⁷ .............................................. H01L 21/8247
[52] U.S. Cl. .......................... 438/260; 257/320; 438/263
[58] Field of Search ..................................... 438/257–267; 257/315–322

[56] References Cited

U.S. PATENT DOCUMENTS

| | | |
|---|---|---|
| 4,099,196 | 7/1978 | Simko . |
| 5,070,032 | 12/1991 | Yuan et al. ................................. 437/43 |
| 5,268,319 | 12/1993 | Harari . |
| 5,544,103 | 8/1996 | Lambertson ..................... 365/185.15 |
| 5,643,814 | 7/1997 | Chung . |
| 5,686,332 | 11/1997 | Hong . |

*Primary Examiner*—Richard Booth
*Attorney, Agent, or Firm*—Morgan, Lewis & Bockius LLP

[57] ABSTRACT

A flash memory cell and a method of fabricating the same are disclosed in the present invention. A method of fabricating a flash memory cell having a substrate includes the steps of forming a buried data line in the substrate, forming an insulating layer on the substrate including the buried data line, forming an erase gate on the insulating layer, forming an isolation layer by etching the insulating layer with the erase gate as a mask, forming a floating gate having an indentation at least, the indentation of the floating gate corresponding to the erase gate, and forming a control gate on the floating gate.

A flash memory cell includes a substrate, first and second buried data lines in the substrate, an isolation layer on the substrate, a floating gate including a indentation at least on the substrate between the first and second buried data lines, an erase gate over the isolation layer, a part of the erase gate being inserted into the indentation, and a control gates on the floating gate.

16 Claims, 7 Drawing Sheets

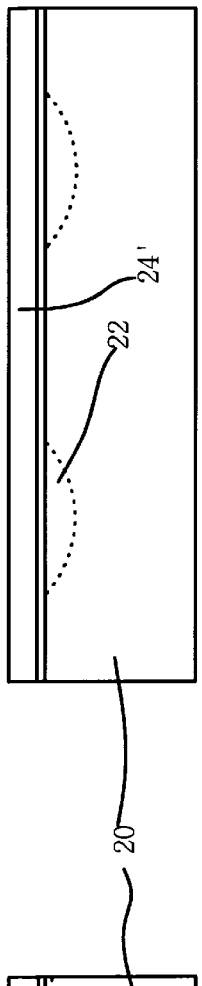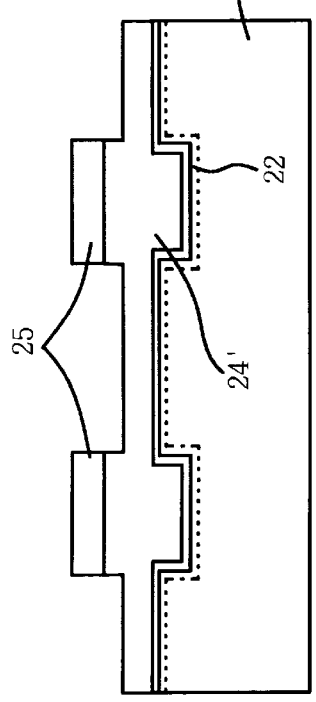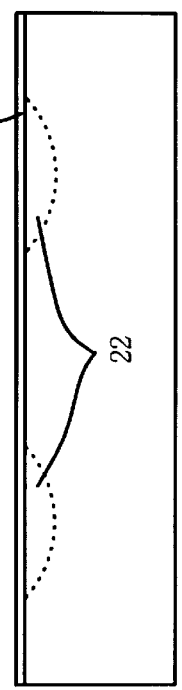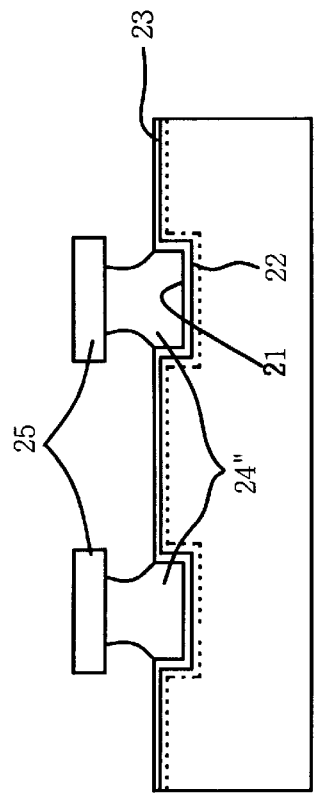

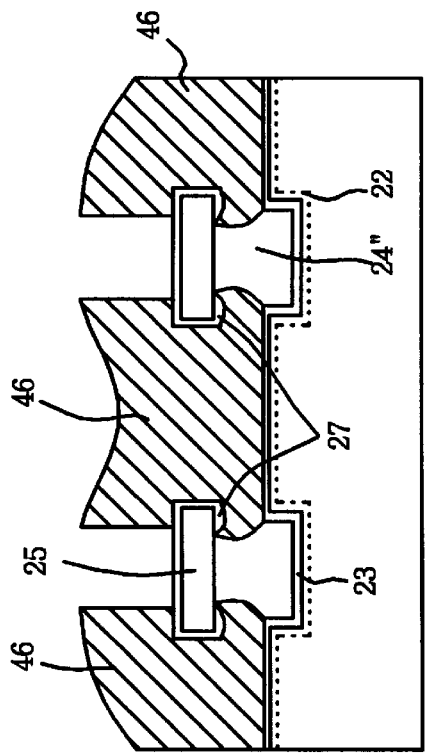
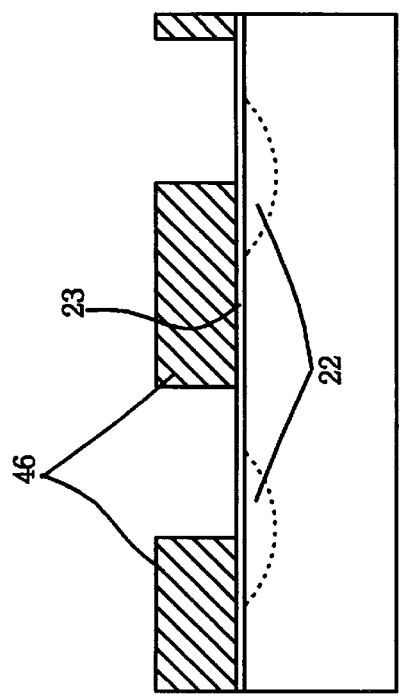
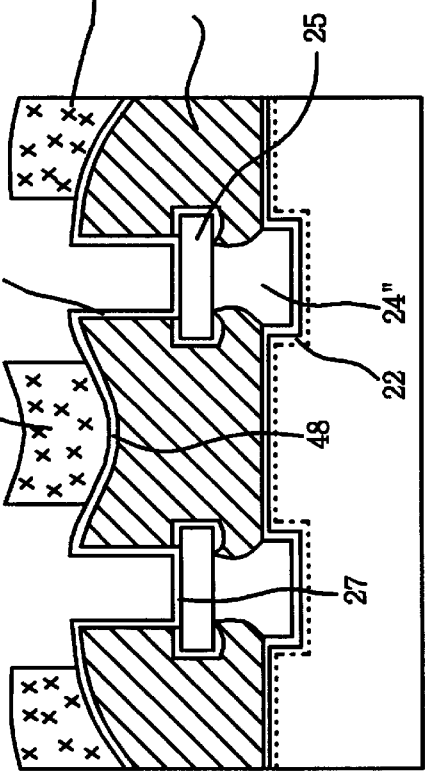
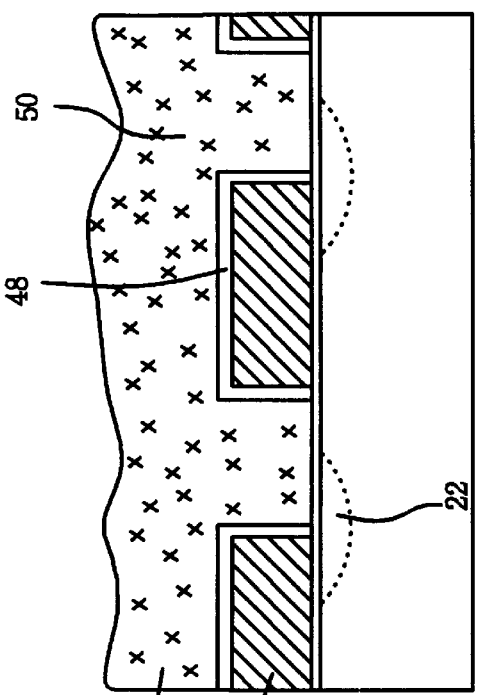

FLASH MEMORY CELL AND METHOD OF FABRICATED THE SAME

This application claims the benefit of Korean Application No. 96-70176 filed on Dec. 23, 1996, which is hereby incorporated by reference.

BACKGROUND OF THE INVENTION

1. Field of the Invention

The present invention relates to a semiconductor memory device, and more particularly, to a flash memory cell and a method of fabricating the same. Although the present invention is suitable for a wide scope of applications, it is particularly suitable for improving the erase function and the topology of the memory cell.

2. Discussion of Related Art

Many studies have been made on semiconductor flash memory cells to fabricate highly integrated devices through simple processes. Related art has been disclosed in U.S. Pat. No. 5,070,032. In a conventional structure of a semiconductor flash memory cell, a device acts as an isolation layer as well. The isolation layer in this structure is formed by depositing an oxide layer on a buried data line. For example, cross-sectional views of a conventional flash memory cell in different directions are illustrated in FIG. 1. In a method of fabricating the conventional flash memory cell as shown in FIG. 1, a buried data line 18 having an $n^+$-type conductivity is formed on a semiconductor substrate 10 by ion-implantation. A high temperature and low pressure dielectric (HLD) layer and a device isolation layer (for example, an oxide layer) are then formed on the substrate 10 including the buried data line 18 to separate an active region from a field region.

Subsequently, a gate oxide layer 11 and a first polysilicon layer are formed on the entire surface of the substrate and then patterned to form a floating gate 12. The floating gate 12 is insulated by an oxide layer formed by oxidation. A second polysilicon layer is deposited on the entire surface of the substrate and then patterned to form a control gate 13.

The control gate 13 is insulated by a first insulating layer. A third polysilicon layer is deposited thereof and patterned to form an erase gate 14. A second insulating layer is further deposited on the entire surface of the substrate. Accordingly, gates and contact holes are formed at portions for desired contact points. Thereafter, the flash memory cell is completed by forming a passivation layer 16 of boronphosphosilicate glass (BPSG) on a metal line 15.

In programming the aforementioned flash memory cell, a high voltage is applied to the control gate and the data line, and electrons are injected into the floating gate at the edge of the gate insulating layer. To erase the programmed data in the flash memory cell, the electrons in the floating gate are removed through the insulating layer between the floating gate and the erase gate.

However, in the conventional flash memory cell, planarization of the memory cell is very difficult because of a step coverage generated by an erase gate formed on a device isolation oxide layer. Moreover, complex etching and plug processes are necessary to form the erase gate.

SUMMARY OF THE INVENTION

Accordingly, the present invention is directed to a flash memory cell and a method of fabricating the same that substantially obviates one or more of the problems due to limitations and disadvantages of the related art.

An object of the present invention is to provide a flash memory cell substantially downsized by a trench used in isolating each cell.

Another object of the present invention is to provide a flash memory cell reducing a step coverage by forming an erase gate on an isolation layer located in a trench-forming portion, thereby reducing a height of the erase gate.

Still another object of the present invention is to provide a flash memory cell having a highly improved erase function by contacting a floating gate to the upper and lower lateral end portions of the erase gate and making a larger contact area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a flash memory cell includes the steps of the steps of forming a buried data line in the substrate, forming an insulating layer on the substrate including the buried data line, forming an erase gate on the insulating layer, forming an isolation layer by etching the insulating layer with the erase gate as a mask, forming a floating gate having a indentation at least, the indentation of the floating gate corresponding to the erase gate, and forming a control gate on the floating gate.

In another aspect, the method of fabricating a flash memory cell having a substrate includes the steps of forming a buried data line in the substrate, forming an insulating layer on the substrate including the buried data line, forming an erase gate on the insulating layer, forming an isolation layer by etching the insulating layer with the erase gate as a mask, forming a first floating gate pattern having a indentation at least, the indentation of the first floating gate pattern corresponding to the erase gate, forming a control gate on the first floating gate pattern, and forming a floating gate having a indentation at least, the indentation of the floating gate corresponding to the erase gate.

In a further aspect, a flash memory cell includes a substrate, first and second buried data lines in the substrate, an isolation layer on the substrate, a floating gate including an indentation at least on the substrate between the first and second buried data lines, an erase gate over the isolation layer, a part of the erase gate being inserted into the indentation, and a control gates on the floating gate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A through 9B are cross-sectional views showing the process steps of fabricating the flash memory cell of the first embodiment of the present invention. FIGS. 3A to 11A and 3B to 11B are cross-sectional views taken along the line A—A and B—B of FIG. 2, respectively.

FIGS. 10A through 11B are cross-sectional views showing the process steps of fabricating the flash memory cell of a second embodiment of the present invention.

DETAILED DESCRIPTION OF PREFERRED EMBODIMENT

Reference will now be made in detail to the preferred embodiments of the present invention, examples of which are illustrated in the accompanying drawings.

Figure 1:
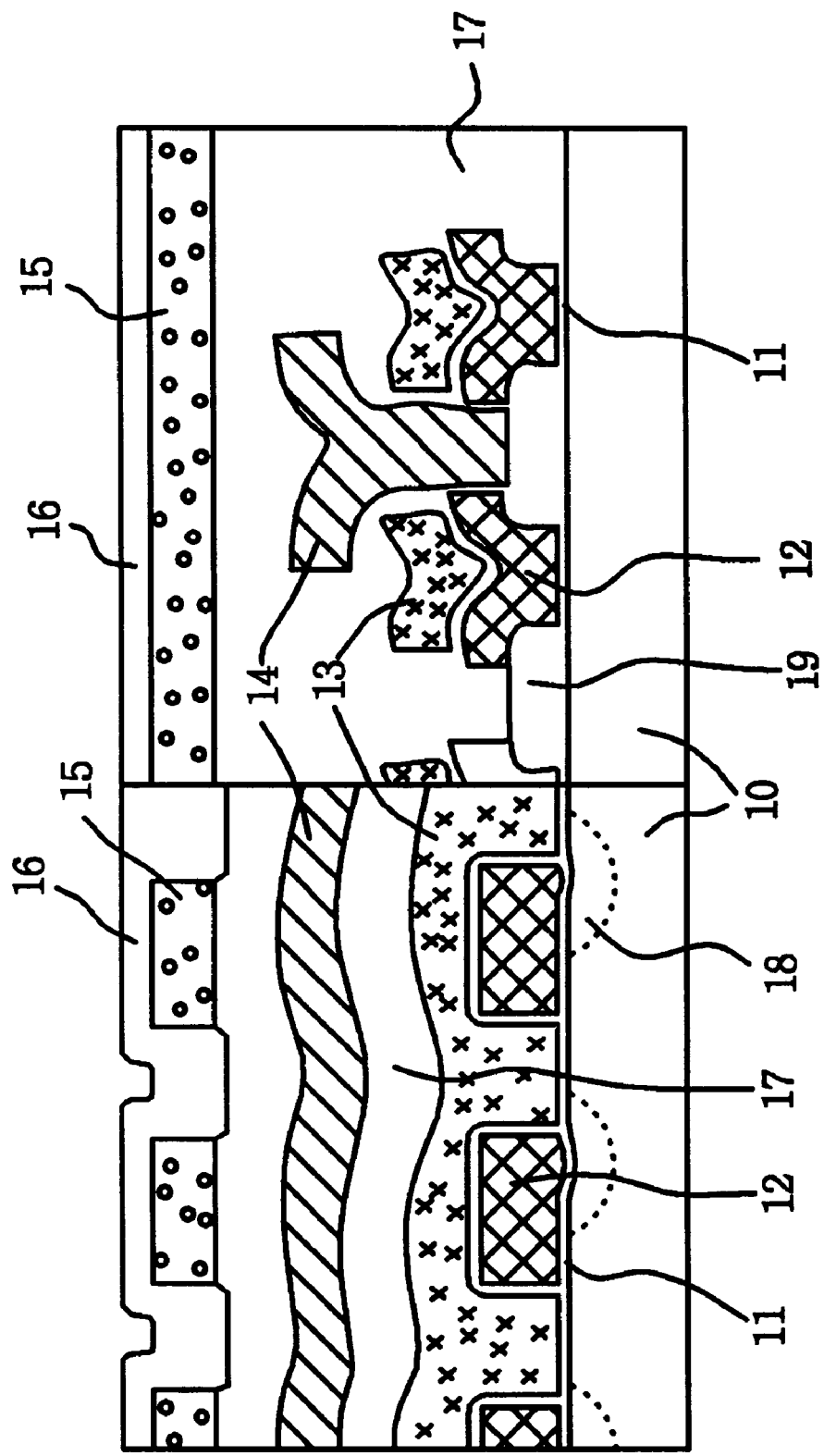
FIG. 1 is cross-sectional views of a conventional flash memory cell.
Figure 2:
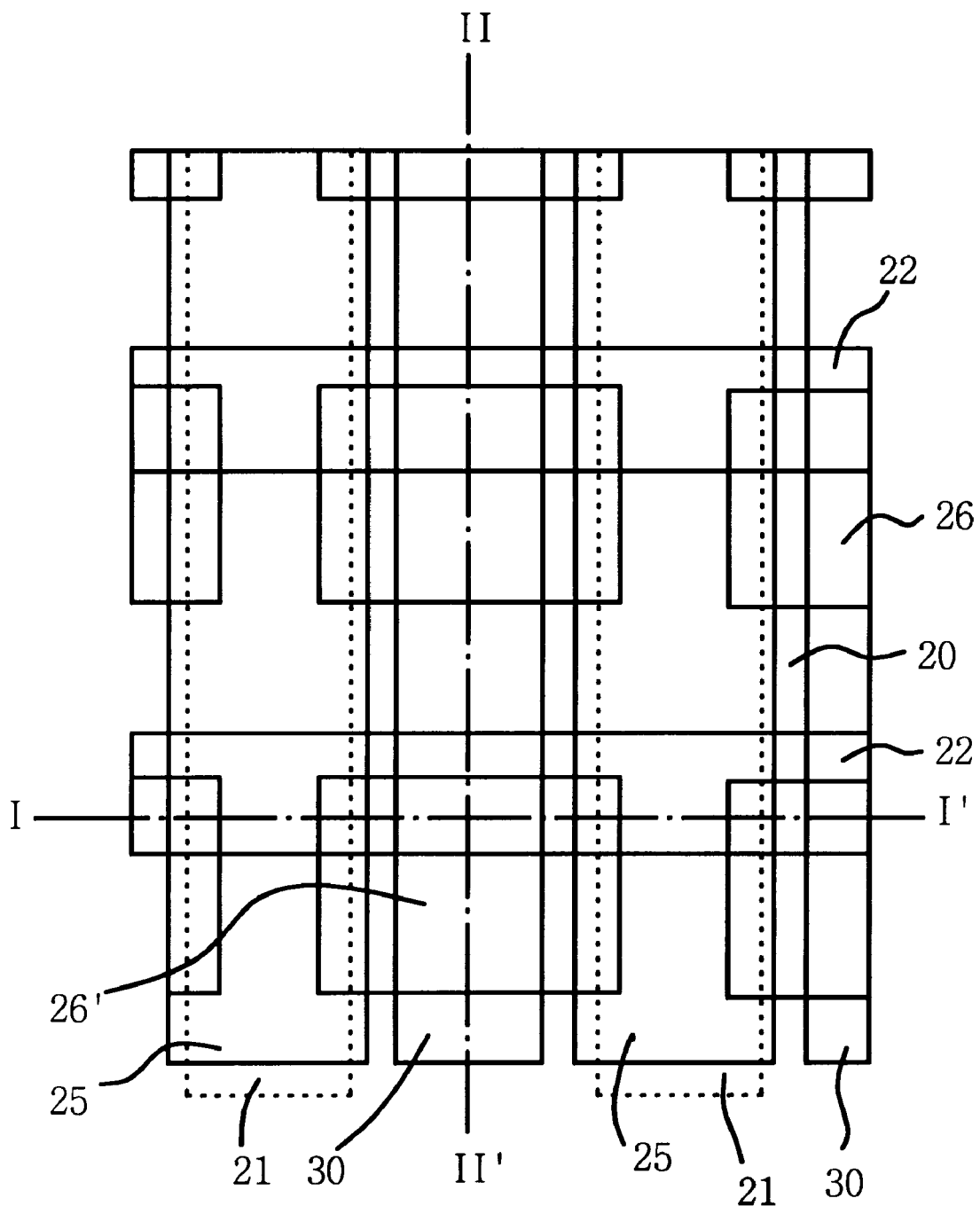
FIG. 2 is a layout of a flash memory cell according to a first embodiment of the present invention.
Figure 3A:
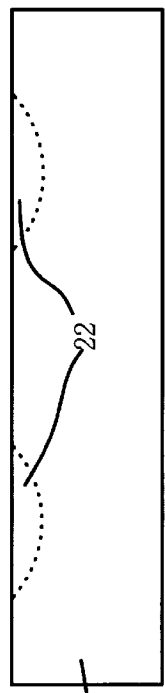
Figure 3B:
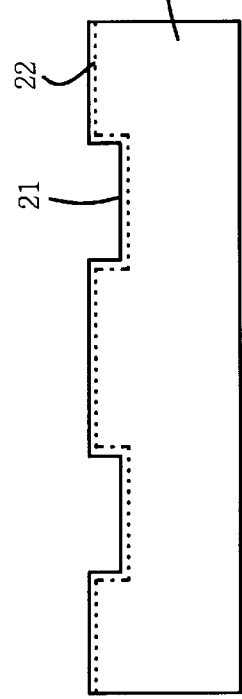

Referring to FIGS. 3A and 3B, a trench 21 is formed in a substrate 20 by selective etching in a first direction. Then, selective ion-implantation and annealing are carried out in a second direction crossing the first direction to form a buried data line 22 in the substrate 20.

Figure 4A:
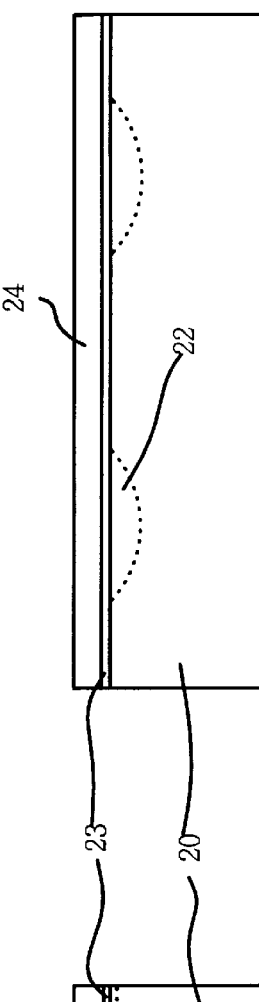
Figure 4B:
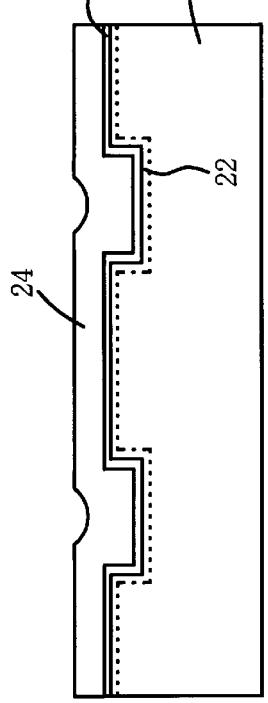

As shown in FIGS. 4A and 4B, an oxide layer 23 and a nitride layer 24 as a first insulating layer are sequentially deposited on the entire surface of the substrate 20.

In FIGS. 5A and 5B, a first polysilicon layer is deposited on the nitride layer 24 and then selectively etched in the first direction to form an erase gate 25 over the trench 21. The erase gate 25 is formed by over-etching the nitride layer 24 by a predetermined depth. An etched nitride layer is depicted by the reference numeral 24' in FIGS. 5A and 5B.

Referring to FIGS. 6A and 6B, the nitride layer 24' is wet-etched so that only a portion between the trench 21 and the erase gate 25 remains on the oxide layer 23 and is then isotropically etched to form an isolation layer 24'. As a result, a portion of bottom surface of the erase gate 25 is exposed.

Figure 7B:
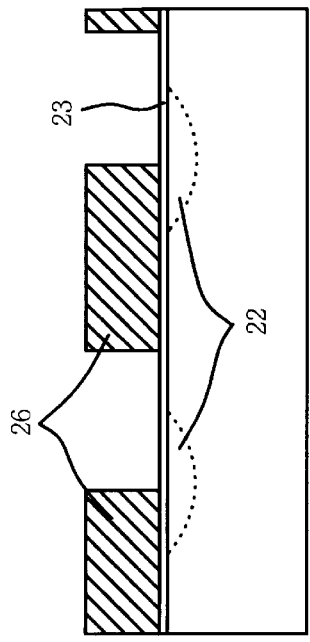
Figure 7A:
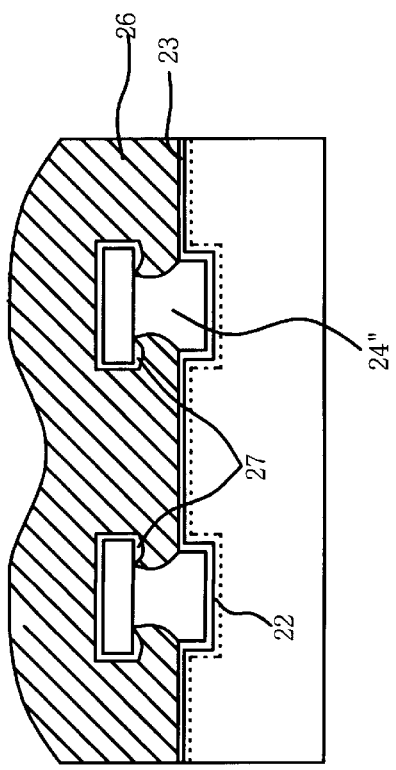

Referring to FIGS. 7A and 7B, after a second insulating layer 27 is formed on the surface of the erase gate 25, a second polysilicon layer is deposited on the entire surface of the substrate 20. Then, a selective etching is performed in the second direction to form a floating gate layer 26 in the same direction as the buried data line 22. However, a partial etching of the oxide layer 23 with an etching solution can damage the characteristic of the oxide layer 23. To avoid this problem, a second insulating layer 27 is formed on the substrate as well as on the surface of the erase gate 25 after the isolation layer 24" is formed. Then, the oxide layer 23 is removed from the substrate. Thus, in this process, the floating gate layer 26 contacts the erase gate 25 because the floating gate layer 26, which has an insulating layer therebetween, surrounds the lateral end portions of the erase gate 25.

Figure 8B:
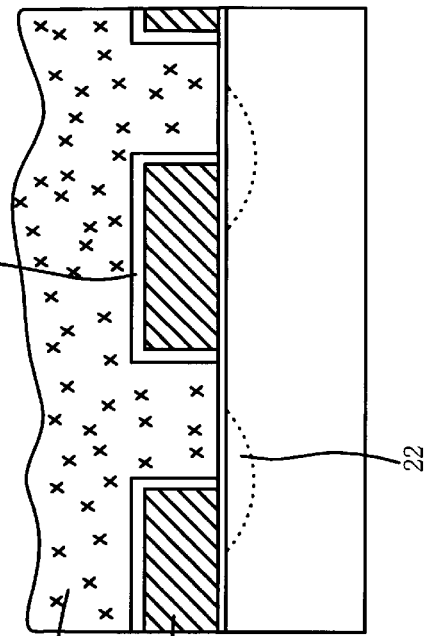
Figure 8A:
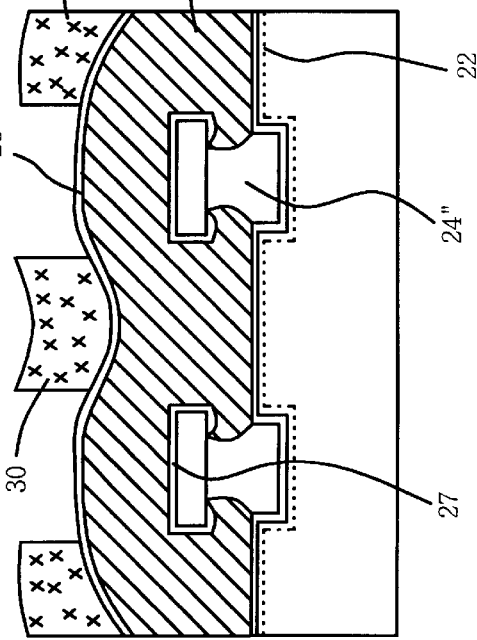

As shown in FIGS. 8A and 8B, a third insulating layer 28 and a third polysilicon layer are deposited on the entire surface of the substrate 20. Then, the third polysilicon layer is selectively etched in the first direction to form a control gate 30 between the trenches 21.

Figure 9A:
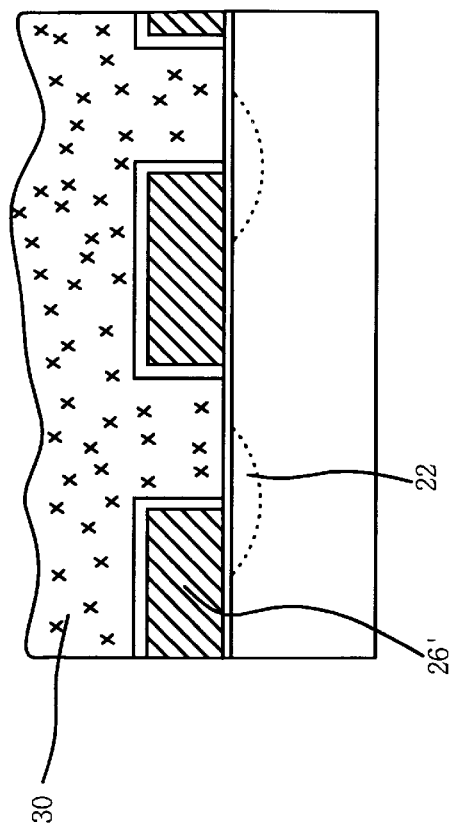
Figure 9B:
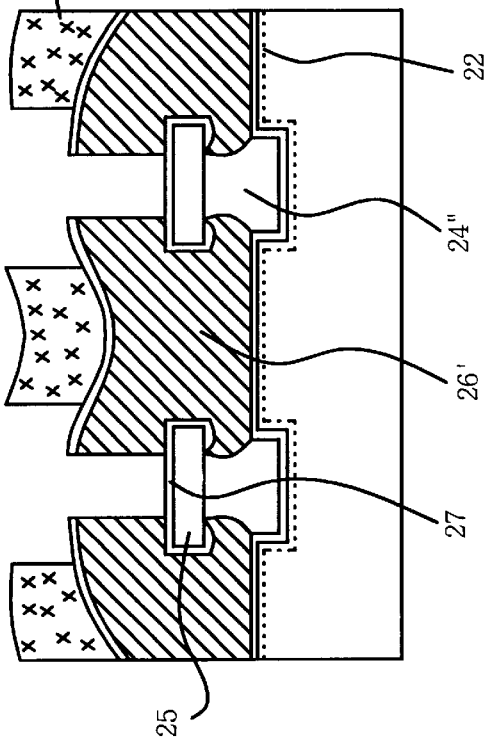

Referring to FIGS. 9A and 9B, portions of the floating gate layer 26' and the third insulating layer between the control gates 30 are selectively etched in the first direction to form a floating gate 26' in each memory cell. Since the floating gate 26' between the second insulating layers 27 surrounds the lateral end portion of the erase gate 25, a contact area corresponding to the erase gate 25 is larger than that of the conventional structure, thereby improving erase function of the memory cell.

Thereafter, the flash memory cell is completed by forming an insulating layer, a passivation layer, a contact hole, and a metal line on the entire surface of the substrate, respectively.

Alternatively, a second embodiment of the present invention to fabricate the flash memory cell may be performed with reference to FIGS. 10A to 11B. The initial process steps shown in FIGS. 3 through 6 for the first embodiment may also used for the second embodiment of the present invention. Thus, a trench 21, a buried data line 22, a first insulating oxide layer 23, a nitride layer 24, and an erase gate 25 are formed on a substrate 20. Subsequently, the nitride layer 24 is isotropically etched to form an isolation layer 24". As a result, portions of the bottom surface of the erase gate 25 is exposed as shown in FIG. 6A.

Referring to FIGS. 10A and 10B, after a second insulating layer 27 is formed on the exposed surface of the erase gate 25, a second polysilicon layer is deposited on the entire surface over the substrate 20. A selective etching is then executed to form a floating gate 46. In this process, characteristics of the oxide of the first insulating layer 23 may be deteriorated by a wet etching process. To prevent this problem, the second insulating layer 27 shown in FIG. 7 may be additionally formed on the substrate 20 after the isolation layer 24" is formed in the substrate 20 and the exposed oxide layer is removed by an etching process.

In FIGS. 11A and 11B, after a third insulating layer 48 is formed on the entire surface over the substrate 20, a third polysilicon layer is deposited on the third insulating layer 48. The third polysilicon layer is then selectively etched to form a control gate 50 on the third insulating layer 48.

Thereafter, the flash memory cell is completed after forming an additional insulating layer, passivation layer, contact hole, and metal line by a conventional method.

Programming of the memory cell in the present invention is executed by injecting electrons into the floating gates through the buried data line and the control gates. On the other hand, programmed data in the memory cell is erased when the electrons in the floating gates are removed.

It will be apparent to those skilled in the art that various modifications and variations can be made in the method of fabricating a flash memory cell in accordance with the present invention without departing from the spirit or scope of the invention. Thus, it is intended that the present invention cover the modifications and variations of this invention provided they come within the scope of the appended claims and their equivalents.

What is claimed is:

1. A method of fabricating a flash memory cell having a substrate, comprising the steps of:

forming a buried data line in the substrate;

forming an insulating layer on the substrate including the buried data line;

forming an erase gate on the insulating layer;

forming an isolation layer by etching the insulating layer with the erase gate as a mask;

forming a floating gate having a indentation at least, the indentation of the floating gate corresponding to the erase gate; and forming a control gate on the floating gate.

2. The method according to claim 1, wherein the step of etching the insulating layer includes wet etching.

3. The method according to claim 1, wherein the step of etching the insulating layer is performed in the order of dry etching and wet etching.

4. The method according to claim 1, further comprising the step of forming an isolation layer on the trenches prior to the step of forming an erase gate.

5. The method according to claim 4, wherein the trench is formed under the isolation layer.

6. The method according to claim 4, wherein a width of the erase gate is wider than that of the trench.

7. The method according to claim 1, wherein the insulating layer includes an oxide layer.

8. The method according to claim 1, wherein the insulating layer includes an oxide layer and a nitride layer on the oxide layer.

9. The method according to claim 1, wherein the step of forming a buried data line includes selective ion implantation.

10. The method according to claim 1, wherein the erase gate, the floating gate, and the control gate include polysilicon.

11. The method according to claim 1, wherein the erase gate, the floating gate, and the control gate are electrically isolated, respectively.

12. A method of fabricating a flash memory cell having a substrate, comprising the steps of:

forming a buried data line in the substrate;

forming an insulating layer on the substrate including the buried data line;

forming an erase gate on the insulating layer;

forming an isolation layer by etching the insulating layer with the erase gate as a mask;

forming a first floating gate pattern having a indentation at least, the indentation of the first floating gate pattern corresponding to the erase gate;

forming a control gate on the first floating gate pattern; and forming a floating gate having a indentation at least, the indentation of the floating gate corresponding to the erase gate.

13. The method according to claim 12, wherein the step of forming the control gate and the floating gate is performed simultaneously.

14. The method according to claim 12, wherein the step of forming the buried data line includes selective ion implantation.

15. The method according to claim 12, wherein the insulation layer includes oxide.

16. The method according to claim 12, wherein the erase gate, the floating gate, and the control gate include doped polysilicon.

* * * * *